(12) United States Patent
Oka

(10) Patent No.: US 9,274,170 B2
(45) Date of Patent: Mar. 1, 2016

(54) SEMICONDUCTOR DEVICE

(71) Applicant: Seiko Instruments Inc., Chiba-shi, Chiba (JP)

(72) Inventor: Tomohiro Oka, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 105 days.

(21) Appl. No.: 14/256,444

(22) Filed: Apr. 18, 2014

(65) Prior Publication Data

US 2014/0325300 A1    Oct. 30, 2014

(30) Foreign Application Priority Data

Apr. 25, 2013   (JP) .................................. 2013-092787

(51) Int. Cl.
*G01R 31/3177*    (2006.01)
*G01R 31/317*    (2006.01)

(52) U.S. Cl.
CPC ...... *G01R 31/3177* (2013.01); *G01R 31/31701* (2013.01); *G01R 31/31703* (2013.01)

(58) Field of Classification Search
CPC .................................................. G01R 31/3187
USPC .......................................... 714/726, 719, 799
See application file for complete search history.

(56) References Cited

U.S. PATENT DOCUMENTS

| 5,442,641 A | * | 8/1995 | Beranger ............... G11C 29/40 714/719 |
| 5,504,755 A | * | 4/1996 | Nozuyama ...... G01R 31/318516 714/725 |
| 5,561,671 A | * | 10/1996 | Akiyama ............... G11C 29/36 714/718 |
| 5,835,436 A | * | 11/1998 | Ooishi ..................... G11C 7/10 365/222 |

FOREIGN PATENT DOCUMENTS

JP    2007-067180 A    3/2007

* cited by examiner

*Primary Examiner* — Fritz Alphonse
(74) *Attorney, Agent, or Firm* — Brinks Gilson & Lione

(57) ABSTRACT

Provided is a semiconductor device including a test mode circuit capable of changing the semiconductor device into a test mode with fewer malfunctions and without providing a test terminal. The semiconductor device includes a test circuit configured to compare data of a data input terminal and a data output terminal in synchronization with clock, and control whether or not to change the semiconductor device into a test mode in accordance with a result of the comparison.

3 Claims, 4 Drawing Sheets ved with a test terminal. This can reduce the number of terminals, and so can reduce the area of a semiconductor device and the footprint thereof.

SEMICONDUCTOR DEVICE

RELATED APPLICATIONS

This application claims priority under 35 U.S.C. §119 to Japanese Patent Application No. 2013-092787 filed on Apr. 25, 2013, the entire content of which is hereby incorporated by reference.

BACKGROUND OF THE INVENTION

1. Field of the Invention

The present invention relates to semiconductor devices including a test circuit, and more particularly relates to a test circuit to change a semiconductor device to a test mode.

2. Background Art

It is an effective technique for manufacturing of semiconductor devices to improve efficiency of a shipping test to keep the quality of the devices and reduce its manufacturing cost. As a method to improve the efficiency of the test, some ICs are equipped with a test-mode function that is used only for the test, aside from functions that are used by users. Such a test mode is equipped with unique functions other than functions that users require, such as a function to output an internal node state and a function to rewrite a memory IC by one operation, and so can improve the efficiency of the test. Such test-mode functions require a method to implement the mode in a state that is not available by users, and a configuration for changing has to be devised so as not to let a user change the device into the test mode erroneously. An available method to change the semiconductor device into a test mode includes implementing a test mode function using a test terminal (see Patent document 1, for example).

[Patent Document 1] Japanese Patent Application Laid-Open No. 2007-67180

SUMMARY OF THE INVENTION

A method including such an additional test terminal, however, increases a terminal that is not necessary for a user, which is not suitable for a tendency for smaller-area devices in recent years.

Then, in order to solve the above problem, the present invention discloses a method to change a semiconductor device into a test mode that causes few malfunctions without adding a test terminal.

A semiconductor device including a test circuit of the present invention has the following configuration.

A semiconductor device includes: a plurality of data registers connected in series that temporarily holds instruction input from a data input terminal in synchronization with a clock signal; an instruction decoder that identifies whether data output from the plurality of data registers is a normal instruction or a test instruction, and when the data is a test instruction, outputs a test instruction signal; a comparator that compares instruction data and data of the data output terminal in synchronization with the clock signal, and outputs a detected signal thereof; a latch circuit that designates the detected signal output from the comparator as a set signal; and a logic circuit capable of selecting whether the test instruction signal is to be output or not in accordance with a signal output from the latch circuit.

According to the present invention, a semiconductor device including a test circuit is capable of changing its mode into a test mode with fewer malfunctions and without provid-

DESCRIPTION OF THE PREFERRED EMBODIMENTS

Figure 1:
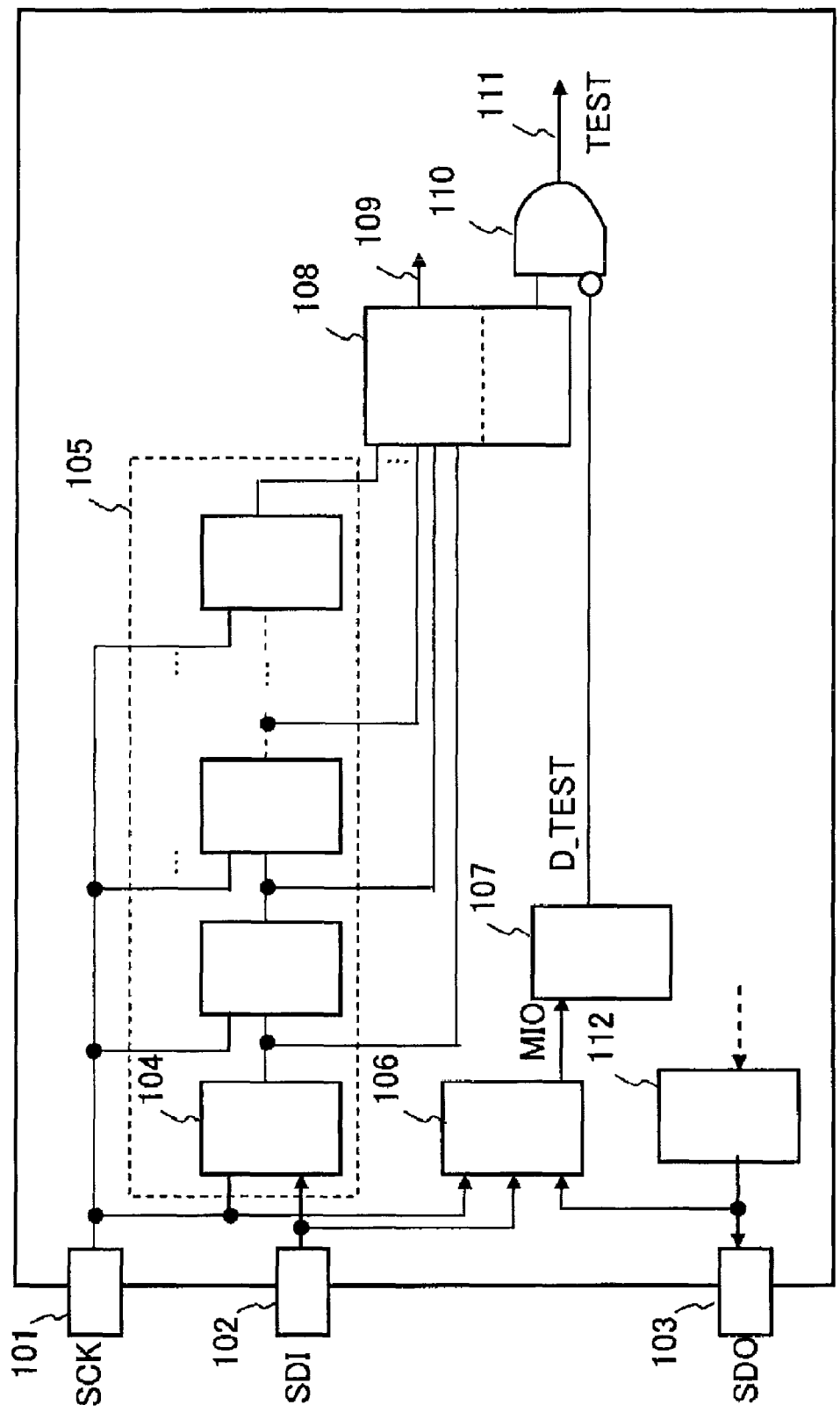
FIG. 1 shows a configuration of a semiconductor device including a test circuit of the present embodiment.

FIG. 1 shows the configuration of a semiconductor device including a test circuit of the present embodiment.

The semiconductor device of the present invention has a circuit including a clock input terminal 101, a data input terminal 102, a data output terminal 103, a register group 105 made up of a plurality of data registers 104, a comparator 106, a latch 107, an instruction decoder 108, and an output buffer 112.

The register group 105 includes the data registers 104 connected in series, and temporarily holds a value of instruction data SDI of the data input terminal 102 and outputs the same in synchronization with clock SCK that is input to the clock input terminal 101. The instruction decoder 108 identifies a normal instruction and a test instruction, which are determined beforehand, based on a value of data output from the register group 105. The comparator 106 compares instruction data SDI of the data input terminal 102 and data SDO of the data output terminal 103 in synchronization with the rising edge of the clock SCK. The latch 107 receives an output signal MIO of the comparator 106 as an input and outputs a test instruction disable signal D_TEST. The data output terminal 103 is provided with the output buffer 112.

The following describes an operation of the semiconductor device including a test circuit of the present embodiment.

Figure 3:
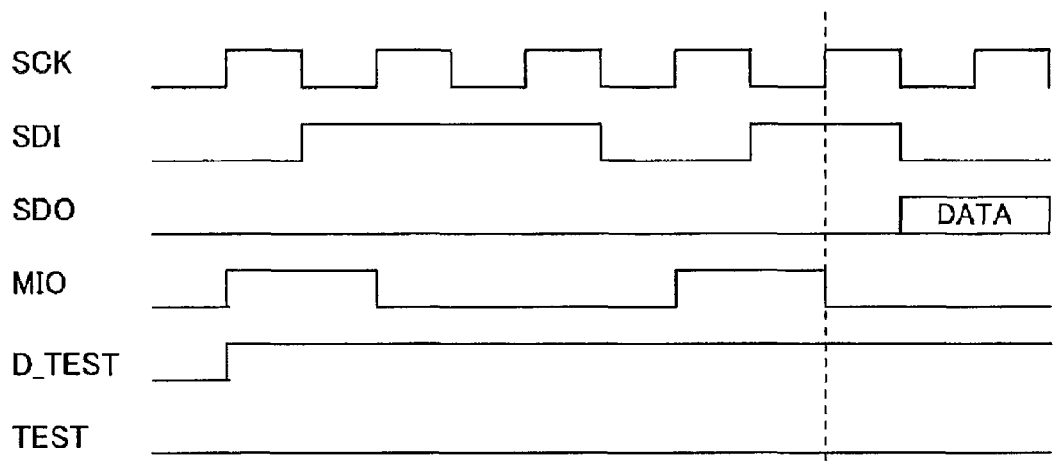
FIG. 3 shows a signal waveform indicating a normal operation of the semiconductor device.

FIG. 3 shows a signal waveform indicating a normal operation of the semiconductor device.

Clock SCK is input to the clock input terminal 101. Instruction data SDI as a normal instruction in synchronization with the clock SCK is input to the data input terminal 102. The instruction data SDI is then output from the register group 105, and is determined as a normal instruction by the instruction decoder 108. Then, the semiconductor device determines its operation in accordance with the normal instruction.

In the normal operation, the data input terminal 102 and the data output terminal 103 are connected independently with each other or via a resistor, and so when the semiconductor device receives an instruction, values of the data input terminal and the data output terminal agree, or repeat disagreement and agreement. The comparator 106 compares, in synchronization with rising edge of the clock SCK, instruction data SDI of the data input terminal 102 and data SDO of the data output terminal 103, and when the data agree, the comparator 106 sets the output signal MIO at a high level, for example. The latch 107 is set by the output signal MIO to output a test instruction disable signal D_TEST to a logic circuit 110 so as not to output a test instruction signal 111.

As stated above, in the normal operation, instruction data SDI as a normal instruction that is input to the data input terminal 102 is decoded by the instruction decoder 108, and is output as a normal instruction signal 109. Then, since the logic circuit 110 does not output a test instruction signal 111, the semiconductor device keeps the normal operation.

Figure 4:
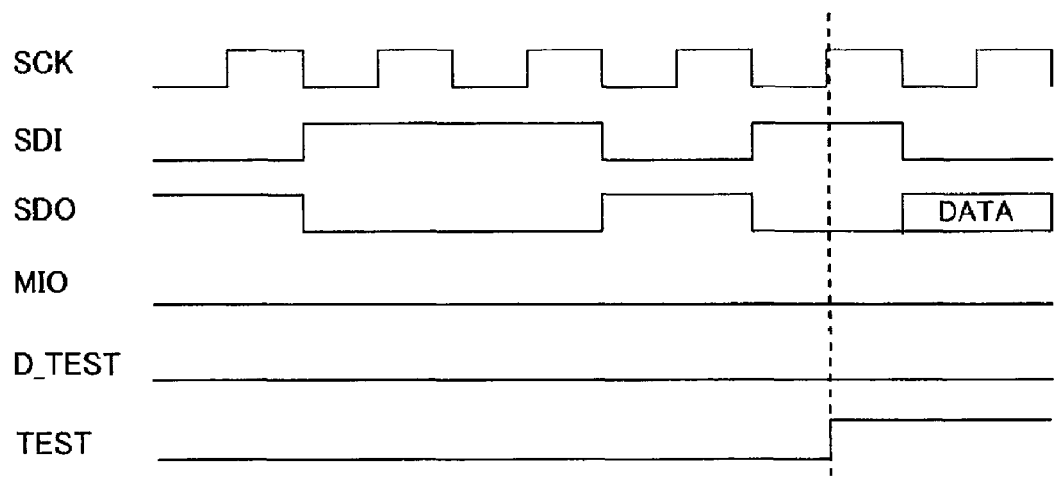
FIG. 4 shows a signal waveform when the mode is changed into a test mode by a test circuit of the present embodiment.

FIG. 4 shows a signal waveform when the mode is changed into a test mode by a test circuit of the present embodiment.

To change a semiconductor device into a test mode, instruction data SDI as a test instruction that is in synchronization with clock SCK is input to the data input terminal 102, and data SDO that disagrees with the test instruction at the time of rising of the clock SCK is input to the data output terminal 103. The comparator 106 compares data of the data input terminal and the data output terminal, and the disagreement state is always kept, and so no test instruction disable signal D_TEST is output. Then, the instruction decoder 108 determines the instruction data SDI as a test instruction, and then outputs a test instruction signal 111 from the logic circuit 110, thus changing the semiconductor device into a test mode.

Alternatively, the comparator 106 of the test circuit of the present embodiment may be configured to compare instruction data SDI and data SDO, and when the data disagree, to set the output signal MIO at a high level, for example. The logic for other signals also is not limited especially to FIG. 3 and FIG. 4, as long as their functions are implemented.

Figure 2:
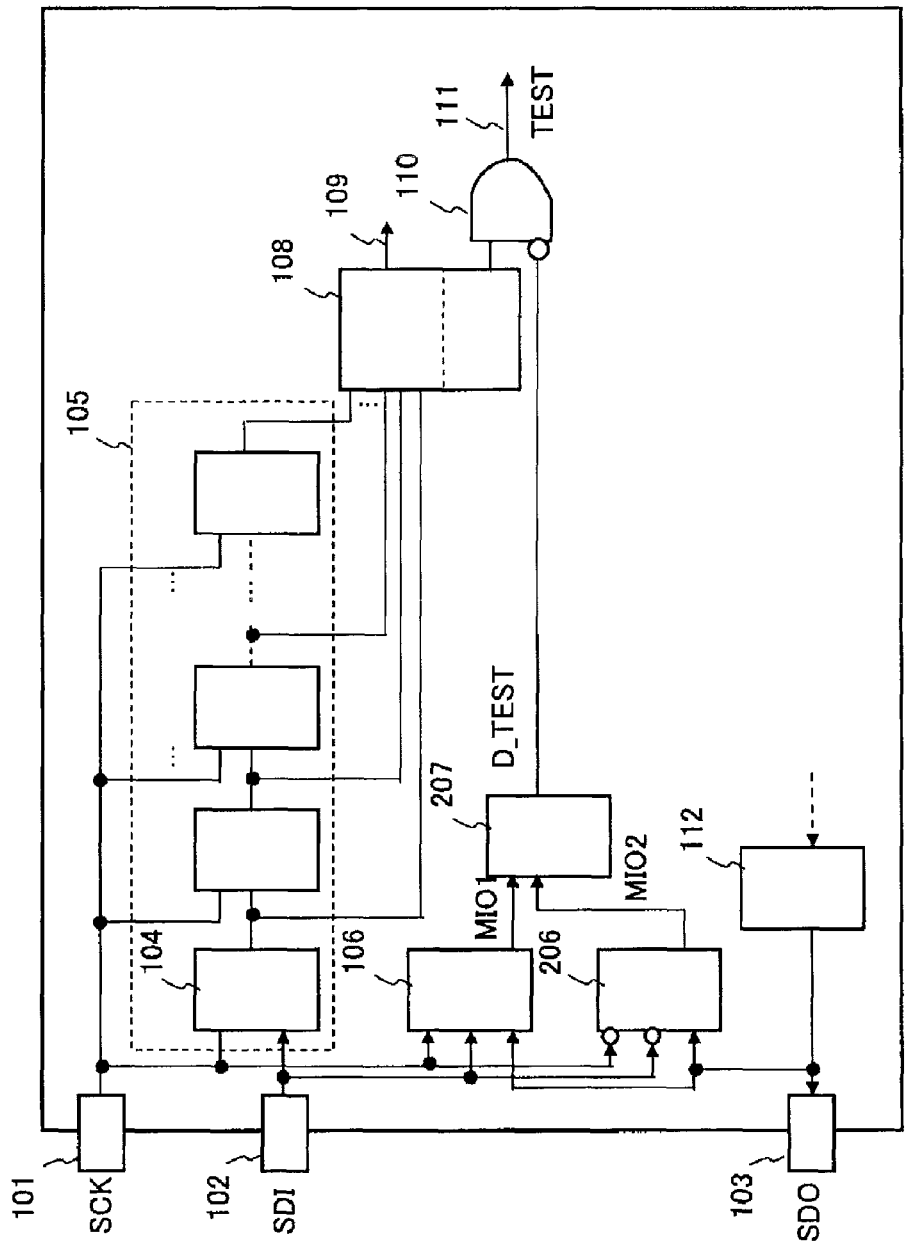
FIG. 2 shows a configuration of a semiconductor device including another exemplary test circuit.

FIG. 2 shows the configuration of a semiconductor device including another exemplary test circuit.

The test circuit of FIG. 2 includes an additional second comparator 206 and a latch 207 instead of the latch 107.

The second comparator 206 compares instruction data SDI of the data input terminal 102 and data SDO of the data output terminal 103 at the time of falling of the clock SCK, and when the data disagree, the second comparator 206 sets an output signal MIO2 at a high level. The latch 207 receives an output signal MIO1 of the comparator 106 and the output signal MIO2 of the second comparator 206 as an input, and if one of them is at a high level, the latch 207 outputs a test instruction disable signal D_TEST.

Figure 5:
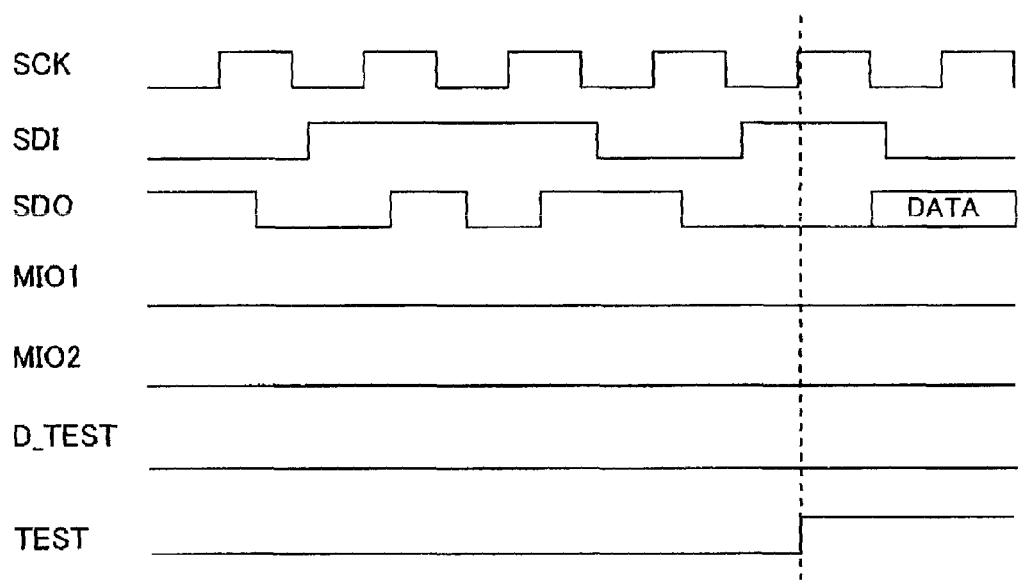
FIG. 5 shows a signal waveform when the mode is changed into a test mode by another exemplary test circuit of the present embodiment.

FIG. 5 shows a signal waveform when the mode is changed into a test mode by another exemplary test circuit of the present embodiment.

To change a semiconductor device into a test mode, a test instruction that is synchronization with clock SCK is input to the data input terminal 102, and data SDO that disagrees with the test instruction at the time of rising of the clock SCK and that agrees with the test instruction at the time of falling of the clock SCK is input to the data output terminal 103. The comparator 106 compares data of the data input terminal and the data output terminal, and since the disagreement state is always kept, no test instruction disable signal D_TEST is output. The comparator 206 compares data of the data input terminal and the data output terminal, and since the agreement state is always kept, no test instruction disable signal D_TEST is output. Therefore, the instruction decoder 108 determines the instruction data SDI as a test instruction, and then outputs a test instruction signal 111 from the logic circuit 110, thus changing the semiconductor device into a test mode.

The semiconductor device including a test circuit of the present embodiment further can reduce malfunctions.

As stated above, according to the semiconductor device including a test circuit of the present embodiment, any new terminal is not required to change the semiconductor device into a test mode, and a method to change it into a test mode can achieve a semiconductor device that is reliable and with low possibility of malfunctions.

Conditions to set the output signal MIO1 and the output signal MIO2 by the comparator 106 and second comparator 206 of the test circuit of the present embodiment or the logic for other signals are not limited especially to FIG. 5 as long as their functions are implemented.

What is claimed is:

1. A semiconductor device, comprising:
   a clock input terminal, to which a clock signal is input;
   an instruction data input terminal, to which instruction data is input;
   a data output terminal, to/from which data is input/output;
   a plurality of data registers connected in series that temporarily holds the instruction input from the data input terminal in synchronization with the clock signal;
   an instruction decoder that identifies whether data output from the plurality of data registers is a normal instruction or a test instruction, and when the data is a test instruction, outputs a test instruction signal;
   a comparator that compares instruction data input to the data input terminal and data of the data output terminal in synchronization with the clock signal, and outputs a detected signal having a signal level responsive to relative signal levels of the instruction data and the data of the data output terminal;
   a latch circuit that designates the detected signal output from the comparator as a set signal; and
   a logic circuit capable of selecting whether the test instruction signal is to be output or not in accordance with a signal output from the latch circuit.

2. The semiconductor device according to claim 1, wherein the comparator compares instruction data input to the data input terminal and data of the data output terminal at a time of rising of the clock signal.

3. The semiconductor device according to claim 2 further comprising a second comparator that compares instruction data input to the data input terminal and data of the data output terminal at a time of falling of the clock signal,
   wherein the latch circuit designates a detected signal output from the comparator and a detected signal output from the second comparator as a set signal.

* * * * *